(12) United States Patent
Min et al.

(10) Patent No.: US 8,525,319 B2
(45) Date of Patent: Sep. 3, 2013

(54) SELECTING CHIPS WITHIN A STACKED SEMICONDUCTOR PACKAGE USING THROUGH-ELECTRODES

(75) Inventors: Bok Gyu Min, Icheon-si (KR); Kyoung Sook Park, Icheon-si (KR); Da Un Nah, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 482 days.

(21) Appl. No.: 12/981,443

(22) Filed: Dec. 29, 2010

(65) Prior Publication Data
US 2011/0272804 A1 Nov. 10, 2011

(30) Foreign Application Priority Data
May 6, 2010 (KR) .................. 10-2010-0042454

(51) Int. Cl.
*H01L 23/48* (2006.01)
(52) U.S. Cl.
USPC ........... 257/686; 257/723; 257/724; 257/777; 257/774
(58) Field of Classification Search
USPC ...................... 257/774, 686, 777, 724, 723
See application file for complete search history.

(56) References Cited

U.S. PATENT DOCUMENTS
7,589,390 B2    9/2009   Yao

FOREIGN PATENT DOCUMENTS
JP         06-254762      9/1994
KR     1020030014100 A    2/2003
KR     1020100009041 A    1/2010

*Primary Examiner* — S. V. Clark
*Assistant Examiner* — Krista Soderholm
(74) *Attorney, Agent, or Firm* — William Park & Associates Patent Ltd.

(57) ABSTRACT

A stacked semiconductor package includes first and second semiconductor chips including semiconductor chip bodies which have circuit units, first through-electrodes which pass through the semiconductor chip bodies at first positions, and second through-electrodes which pass through the semiconductor chip bodies at second positions and provide a chip enable signal to the circuit units. A spacer including a spacer body may be interposed between the first semiconductor chip and the second semiconductor chip, with an inverter chip embedded in the spacer body. Wiring patterns formed on the spacer body may connect the first through-electrodes of the first semiconductor chip with the second through-electrodes of the second semiconductor chip, the first through-electrodes of the first semiconductor chip with input terminals of the inverter chip, and output terminals of the inverter chip with the second through-electrodes of the first semiconductor chip.

28 Claims, 7 Drawing Sheets

SELECTING CHIPS WITHIN A STACKED SEMICONDUCTOR PACKAGE USING THROUGH-ELECTRODES

CROSS-REFERENCE TO RELATED APPLICATIONS

The present application claims priority to Korean patent application number 10-2010-42454 filed on May 6, 2010, which is incorporated herein by reference in its entirety.

BACKGROUND OF THE INVENTION

The present invention relates to selecting chips within a stacked semiconductor package using through-electrodes.

In the semiconductor industry, packaging technologies for integrated circuits have continuously been developed to satisfy the demand toward miniaturization and mounting reliability. Recently, as miniaturization and high performance in demand for electric and electronic products, various stacking techniques have been developed.

The term "stack" that is referred to in the semiconductor industry means to vertically place together at least two semiconductor chips or semiconductor packages. In the case of a memory device, by using stacking technology, it is possible to realize a product having memory capacity at least two times greater than without stacking. Since stacked semiconductor packages have advantages in terms of not only memory capacity but also mounting density and mounting area utilization efficiency, research and development for stacked semiconductor packages have accelerated.

Use of through-electrodes have been proposed for stacked semiconductor packaging. For this type of package, through-electrodes are formed in semiconductor chips such that the semiconductor chips can be electrically connected by the through-electrodes.

BRIEF SUMMARY OF THE INVENTION

Embodiments of the present invention are directed to a stacked semiconductor package which uses through-electrodes.

In one embodiment of the present invention, a stacked semiconductor package includes: first and second semiconductor chips including semiconductor chip bodies which have circuit units, first through-electrodes which pass through the semiconductor chip bodies at first positions, and second through-electrodes which pass through the semiconductor chip bodies at second positions and provide a chip enable signal to the circuit units; and a spacer including a spacer body which is interposed between the first semiconductor chip and the second semiconductor chip, an inverter chip which is embedded in the spacer body, and wiring patterns which are formed on the spacer body and connect the first through-electrodes of the first semiconductor chip with the second through-electrodes of the second semiconductor chip, the first through-electrodes of the first semiconductor chip with input terminals of the inverter chip, and output terminals of the inverter chip with the second through-electrodes of the first semiconductor chip.

The first and second semiconductor chips may be the same kind.

The first and second semiconductor chips may further include third through-electrodes which pass through the respective semiconductor chip bodies and provide data inputted from an outside to the circuit units or output data provided from the circuit units to the outside.

The wiring patterns may include data wiring lines which connect the third through-electrodes of the first semiconductor chip with the third through-electrodes of the second semiconductor chip.

The spacer body may comprise, for example, a prepreg and an insulation film.

The wiring patterns may include multi-layered circuit wiring lines and through-vias which are formed in the spacer body and connect the first through-electrodes of the first semiconductor chip with the second through-electrodes of the second semiconductor chip, the first through-electrodes of the first semiconductor chip with the input terminals of the inverter chip, and the output terminals of the inverter chip with the second through-electrodes of the first semiconductor chip.

The wiring patterns may include: first circuit wiring lines formed on a first surface of the spacer body which corresponds to the first semiconductor chip, and connecting the first through-electrodes of the first semiconductor chip with the input terminals of the inverter chip; second circuit wiring lines formed on the first surface of the spacer body and connecting the output terminals of the inverter chip with the second through-electrodes of the first semiconductor chip; third circuit wiring lines formed on a second surface of the spacer body which faces away from the first surface, and connected to the second through-electrodes of the second semiconductor chip; and first through-vias passing through the first and second surfaces of the spacer body and connecting the first circuit wiring lines with the third circuit wiring lines.

The stacked semiconductor package may further include connection members formed between the input terminals of the inverter chip and the first circuit wiring lines and between the output terminals of the inverter chip and the second circuit wiring lines.

The connection members may include bonding wires, bumps, or anisotropic conductive films.

The stacked semiconductor package may further include conductive connection members formed between the first and second through-electrodes of the first semiconductor chip and the wiring patterns and between the second through-electrodes of the second semiconductor chip and the wiring patterns.

The conductive connection members may include bumps, anisotropic conductive films or solder balls.

The stacked semiconductor package may further include: a substrate supporting the first and second semiconductor chips and the spacer, and having an upper surface which corresponds to the first semiconductor chip and on which connection pads connected with the first and second through-electrodes of the first semiconductor chip are disposed and a lower surface which faces away from the upper surface and on which ball lands are disposed; a molding member sealing the upper surface of the substrate including the first and second semiconductor chips and the spacer; and external connection terminals attached to the ball lands.

In another embodiment of the present invention, a stacked semiconductor package includes: first, second, third and fourth semiconductor chips including semiconductor chip bodies which have circuit units, first and second through-electrodes which pass through the semiconductor chip bodies at first positions and second positions, and third through-electrodes which pass through the semiconductor chip bodies at third positions and provide a chip enable signal to the circuit units; a first spacer including a first spacer body which is interposed between the first semiconductor chip and the second semiconductor chip, a first inverter chip which is embedded in the first spacer body, and first wiring patterns which are formed on the first spacer body and connect the first through-electrodes of the first semiconductor chip with the first through-electrodes of the second semiconductor chip, the second through-electrodes of the first semiconductor chip with the third through-electrodes of the second semiconductor chip, the second through-electrodes of the first semiconductor chip with input terminals of the first inverter chip, and output terminals of the first inverter chip with the third through-electrodes of the first semiconductor chip; and a second spacer including a second spacer body which is interposed between the third semiconductor chip and the fourth semiconductor chip, a second inverter chip which is embedded in the second spacer body, and second wiring patterns which are formed on the second spacer body and connect the first through-electrodes of the third semiconductor chip with the third through-electrodes of the fourth semiconductor chip, the first through-electrodes of the third semiconductor chip with input terminals of the second inverter chip, and output terminals of the second inverter chip with the third through-electrodes of the third semiconductor chip, wherein the first, second and third through-electrodes of the third semiconductor chip are respectively mounted to the first, second and third through-electrodes of the second semiconductor chip.

The first, second, third and fourth semiconductor chips may be the same kind.

The first, second, third and fourth semiconductor chips may further include fourth through-electrodes which pass through the respective semiconductor chip bodies and provide data inputted from an outside to the circuit units or output data from the circuit units to the outside.

The first wiring patterns may include data wiring lines which connect the fourth through-electrodes of the first semiconductor chip with the fourth through-electrodes of the second semiconductor chip.

Each of the first and second spacer bodies may comprise, for example, a prepreg and an insulation film.

The first wiring patterns may include multi-layered circuit wiring lines and through-vias which are formed in the first spacer body and connect the first through-electrodes of the first semiconductor chip with the first through-electrodes of the second semiconductor chip, the second through-electrodes of the first semiconductor chip with the third through-electrodes of the second semiconductor chip, the second through-electrodes of the first semiconductor chip with the input terminals of the first inverter chip, and the output terminals of the first inverter chip with the third through-electrodes of the first semiconductor chip.

The first wiring patterns may include: first circuit wiring lines formed on a first surface of the first spacer body which corresponds to the first semiconductor chip, and connecting the second through-electrodes of the first semiconductor chip with the input terminals of the first inverter chip; second circuit wiring lines formed on the first surface of the first spacer body and connecting the output terminals of the first inverter chip with the third through-electrodes of the first semiconductor chip; third circuit wiring lines formed on a second surface of the first spacer body which faces away from the first surface, and connected to the third through-electrodes of the second semiconductor chip; first through-vias passing through the first and second surfaces of the first spacer body and connecting the first through-electrodes of the first semiconductor chip with the first through-electrodes of the second semiconductor chip; and second through-vias passing through the first and second surfaces of the first spacer body and connecting the first circuit wiring lines with the third circuit wiring lines.

The stacked semiconductor package may further include connection members formed between the input terminals of the first inverter chip and the first circuit wiring lines and between the output terminals of the first inverter chip and the second circuit wiring lines.

The connection members may include bonding wires, bumps, or anisotropic conductive films.

The second wiring patterns may include multi-layered circuit wiring lines and through-vias which are formed in the second spacer body and connect the first through-electrodes of the third semiconductor chip with the third through-electrodes of the fourth semiconductor chip, the first through-electrodes of the third semiconductor chip with the input terminals of the second inverter chip, and the output terminals of the second inverter chip with the third through-electrodes of the third semiconductor chip.

The second wiring patterns may include: fourth circuit wiring lines formed on a first surface of the second spacer body which corresponds to the third semiconductor chip, and connecting the first through-electrodes of the third semiconductor chip with the input terminals of the second inverter chip; fifth circuit wiring lines formed on the first surface of the second spacer body and connecting the output terminals of the second inverter chip with the third through-electrodes of the third semiconductor chip; sixth circuit wiring lines formed on a second surface of the second spacer body which faces away from the first surface, and connected to the third through-electrodes of the fourth semiconductor chip; and third through-vias passing through the first and second surfaces of the second spacer body and connecting the fourth circuit wiring lines with the sixth circuit wiring lines.

The stacked semiconductor package may further include connection members formed between the input terminals of the second inverter chip and the fourth circuit wiring lines and between the output terminals of the second inverter chip and the fifth circuit wiring lines.

The connection members may include bonding wires, bumps, or anisotropic conductive films.

The stacked semiconductor package may further include conductive connection members formed between the first, second and third through-electrodes of the first semiconductor chip and the first wiring patterns, between the first and third through-electrodes of the second semiconductor chip and the first wiring patterns, between the first and third through-electrodes of the third semiconductor chip and the second wiring patterns, and between the third through-electrodes of the fourth semiconductor chip and the second wiring patterns.

The conductive connection members may include bumps, anisotropic conductive films or solder balls.

The stacked semiconductor package may further include: a substrate supporting the first, second, third and fourth semiconductor chips and the first and second spacers, and having an upper surface which corresponds to the first semiconductor chip and on which connection pads connected with the first, second and third through-electrodes of the first semiconductor chip are disposed and a lower surface which faces away from the upper surface and on which ball lands are disposed; a molding member sealing the upper surface of the substrate including the first, second, third and fourth semiconductor chips and the first and second spacer; and external connection terminals attached to the ball lands.

DESCRIPTION OF SPECIFIC EMBODIMENTS

Specific embodiments of the present invention will be described in detail with reference to the accompanying drawings.

It is to be understood that the drawings are not necessarily to scale and in some instances proportions may have been exaggerated in order to more clearly depict certain features of the invention.

Figure 1:
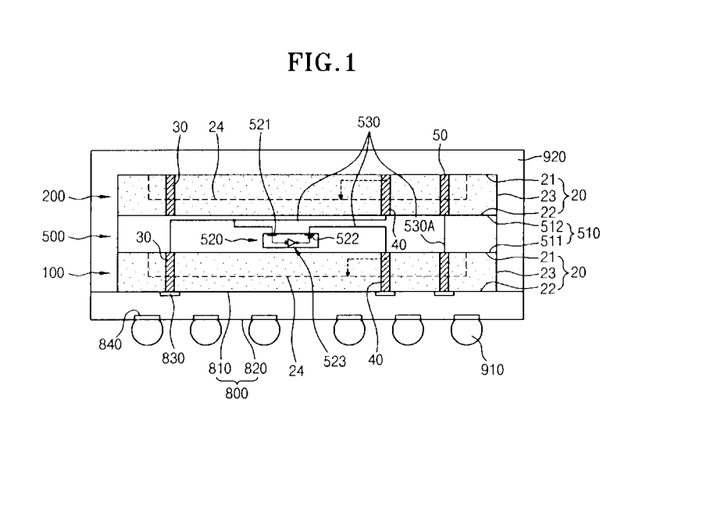
FIG. 1 is a cross-sectional view illustrating a stacked semiconductor package in accordance with an embodiment of the present invention.

FIG. 1 is a cross-sectional view illustrating a stacked semiconductor package in accordance with an embodiment of the present invention.

Referring to FIG. 1, there is shown a stacked semiconductor package 10 comprising first and second semiconductor chips 100 and 200, and a spacer 500. The stacked semiconductor package 10 further includes a substrate 800, external connection terminals 910, and a molding member 920.

The first and second semiconductor chips 100 and 200 can be the same kind of semiconductor chips having the same structure.

Each of the first and second semiconductor chips 100 and 200 includes a semiconductor chip body 20, first through-electrodes 30, and second through-electrodes 40.

The semiconductor chip body 20 can possess, for example, a rectangular hexahedral shape. The semiconductor chip body 20 possessing a rectangular hexahedral shape has a top surface 21, a bottom surface 22, and side surfaces 23. The side surfaces 23 may connect the top surface 21 and the bottom surface 22.

The semiconductor chip body 20 includes circuit units 24 and bonding pads (not shown). The circuit units 24 may include, for example, data storage sections (not shown) for storing data and data processing sections (not shown) for processing data. The bonding pads serve as electrical contact points of the circuit units 24 for connections external to the semiconductor chip body 20. The bonding pads can be disposed on the center portions of the top surface 21 of the semiconductor chip body 20 or adjacent to the edges of the top surface 21 of the semiconductor chip body 20. The bonding pads may also be on the bottom surface 22, or on both the top surface 21 and the bottom surface 22.

The first through-electrodes 30 pass through the top surface 21 and the bottom surface 22 of the semiconductor chip body 20 at first positions on the semiconductor chip body 20. The second through-electrodes 40 pass through the one surface 21 and the other surface 22 of the semiconductor chip body 20 at second positions on the semiconductor chip body 20. The second through-electrodes 40 may be connected to the circuit units 24 through the bonding pads, and communicate a chip enable signal to the circuit units 24. The chip enable signal may be from outside the stacked semiconductor package 10. However, there may be cases where circuitry within the stacked semiconductor package 10 may generate the chip enable signal for other semiconductor chip bodies 20 in the same stacked semiconductor package 10. For example, if a processor chip is packaged with memory chips, the processor chip may generate at least one enable signal for the memory chips.

Each of the first and second semiconductor chips 100 and 200 further include third through-electrodes 50 through which data are input and output. The third through-electrodes 50 may pass through the top surface 21 and the bottom surface 22 of the semiconductor chip body 20. The third through-electrodes 50 may be connected with the circuit units 24 through the bonding pads to provide data to or from the circuit units 24.

The spacer 500 is formed between the first semiconductor chip 100 and the second semiconductor chip 200.

An embodiment of the spacer 500 may include a spacer body 510, an inverter chip 520, and wiring patterns 530.

The spacer body 510 has a first surface 511 and a second surface 512 which faces away from the first surface 511. The first surface 511 of the spacer body 510 corresponds to the first semiconductor chip 100, and the second surface 512 of the spacer body 510 corresponds to the second semiconductor chip 200. The spacer body 510 may comprise, for example, prepreg and insulation film.

The inverter chip 520 in the spacer body 510 may comprise at least one signal inversion unit 523 with an input terminal 521 and an output terminal 522. The signal inversion unit 523 inverts signals at the input terminal 521 and outputs the inverted signal through the output terminal 522. The signal inversion unit 523 may comprise, for example, a NOT gate.

The wiring patterns 530 are formed in the spacer body 510. The wiring patterns 530 may connect the first through-electrodes 30 of the first semiconductor chip 100 with the second through-electrodes 40 of the second semiconductor chip 200, the first through-electrodes 30 of the first semiconductor chip 100 with the input terminal 521 of the inverter chip 520, and the output terminal 522 of the inverter chip 520 with the second through-electrodes 40 of the first semiconductor chip 100. The wiring patterns 530 may also connect the third through-electrodes 50 of the first semiconductor chip 100 with the third through-electrodes 50 of the second semiconductor chip 200. The wiring patterns 530 connecting the third through-electrodes 50 of the first semiconductor chip 100 with the third through-electrodes 50 of the second semiconductor chip 200 may be defined as data wiring lines 530A. The term defined in this way will be used hereafter.

While not shown in a drawing, conductive connection members are respectively formed between the first, second and third through-electrodes 30, 40 and 50 of the first semiconductor chip 100 and the wiring patterns 530, and between the second and third through-electrodes 40 and 50 of the second semiconductor chip 200 and the wiring patterns 530. The conductive connection members may include, for example, bumps, anisotropic conductive films (ACFs), and solder balls.

Detailed configurations of the spacer 500 will be clearly understood from the following descriptions with reference to FIGS. 2 through 5.

The detailed configurations of the spacer 500 will be described below with reference to FIGS. 2 through 5.

Figure 2:
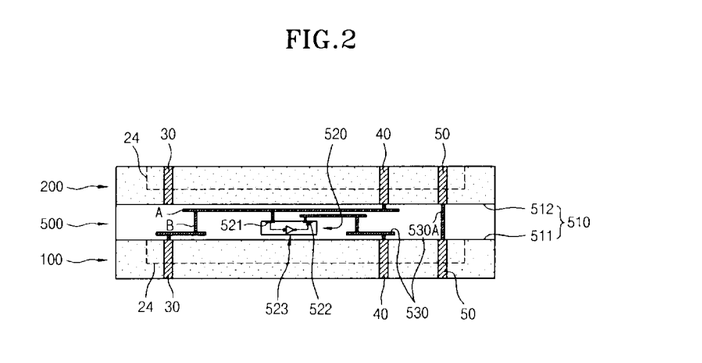
FIGS. 2 through 5 are cross-sectional views illustrating various embodiments of the spacer shown in FIG. 1.

FIG. 2 is a cross-sectional view illustrating an embodiment of the spacer shown in FIG. 1.

Referring to FIG. 2, an embodiment of the spacer 500 includes a spacer body 510, an inverter chip 520, and wiring patterns 530.

The spacer body 510 has a first surface 511 and a second surface 512 which faces away from the first surface 511. The first surface 511 of the spacer body 510 corresponds to a first semiconductor chip 100, and the second surface 512 of the spacer body 510 corresponds to a second semiconductor chip 200. The spacer body 510 may comprise, for example, prepreg and insulation film.

The inverter chip 520 in the spacer body 510 may comprise at least one signal inversion unit 523 with an input terminal 521 and an output terminal 522. The signal inversion unit 523 inverts signals at the input terminal 521 and outputs the inverted signals through the output terminal 522. The signal inversion unit 523 may comprise, for example, a NOT gate.

The wiring patterns 530 include multi-layered circuit wiring lines A and through-vias B formed in the spacer body 510. The wiring patterns 530 connect first through-electrodes 30 of the first semiconductor chip 100 with second through-electrodes 40 of the second semiconductor chip 200, the first through-electrodes 30 of the first semiconductor chip 100 with the input terminal 521 of the inverter chip 520, and the output terminal 522 of the inverter chip 520 with second through-electrodes 40 of the first semiconductor chip 100. The wiring patterns 530 further include data wiring lines 530A connecting third through-electrodes 50 of the first semiconductor chip 100 with third through-electrodes 50 of the second semiconductor chip 200.

Figure 3:
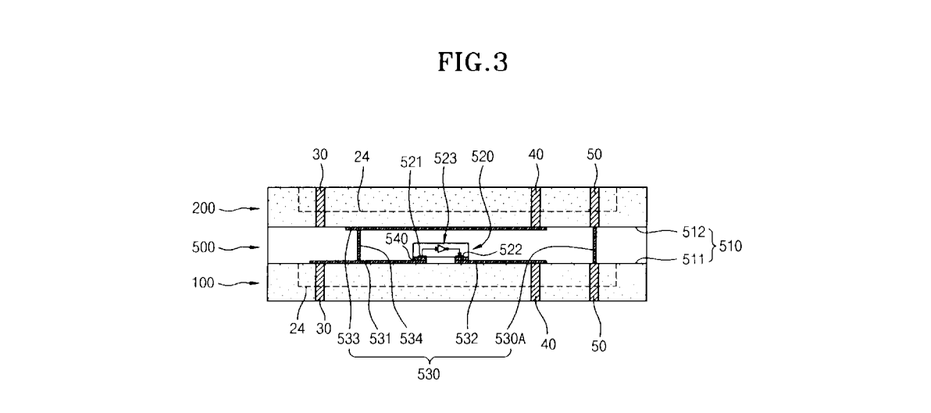

FIG. 3 is a cross-sectional view illustrating an embodiment of the spacer shown in FIG. 1.

Referring to FIG. 3, an embodiment of the spacer 500 includes a spacer body 510, an inverter chip 520, and wiring patterns 530. The spacer 500 may further include connection members 540.

The spacer body 510 has a first surface 511 and a second surface 512 which faces away from the first surface 511. The first surface 511 of the spacer body 510 corresponds to a first semiconductor chip 100, and the second surface 512 of the spacer body 510 corresponds to a second semiconductor chip 200. The spacer body 510 may comprise, for example, prepreg and insulation film.

The inverter chip 520 in the spacer body 510 may comprise at least one signal inversion unit 523 with an input terminal 521 and an output terminal 522. The signal inversion unit 523 inverts signals at the input terminal 521 and outputs the inverted signals through the output terminal 522. The signal inversion units 523 may comprise, for example, a NOT gate.

The wiring patterns 530 include first, second and third circuit wiring lines 531, 532 and 533 and first through-vias 534. The wiring patterns 530 further include data wiring lines 530A.

The first circuit wiring lines 531 are formed on the first surface 511 of the spacer body 510. The first circuit wiring lines 531 connect first through-electrodes 30 of the first semiconductor chip 100 with the input terminal 521 of the inverter chip 520. The second circuit wiring lines 532 are formed on the first surface 511 of the spacer body 510 in such a way as to connect the output terminal 522 of the inverter chip 520 with second through-electrodes 40 of the first semiconductor chip 100.

In the present embodiment, the connection members 540 are formed as anisotropic conductive films connecting the input terminal 521 of the inverter chip 520 with the first circuit wiring line 531 and the output terminal 522 of the inverter chip 520 with the second circuit wiring line 532.

The third circuit wiring lines 533 are formed on the second surface 512 of the spacer body 510, in such a way as to be connected with second through-electrodes 40 of the second semiconductor chip 200.

The first through-vias 534 pass through the first surface 511 and the second surface 512 of the spacer body 510 and connect the first circuit wiring lines 531 with the third circuit wiring lines 533.

The data wiring lines 530A are formed in the shapes of through-vias which pass through the first surface 511 and the second surface 512 of the spacer body 510 and connect third through-electrodes 50 of the first semiconductor chip 100 with third through-electrodes 50 of the second semiconductor chip 200.

Figure 4:
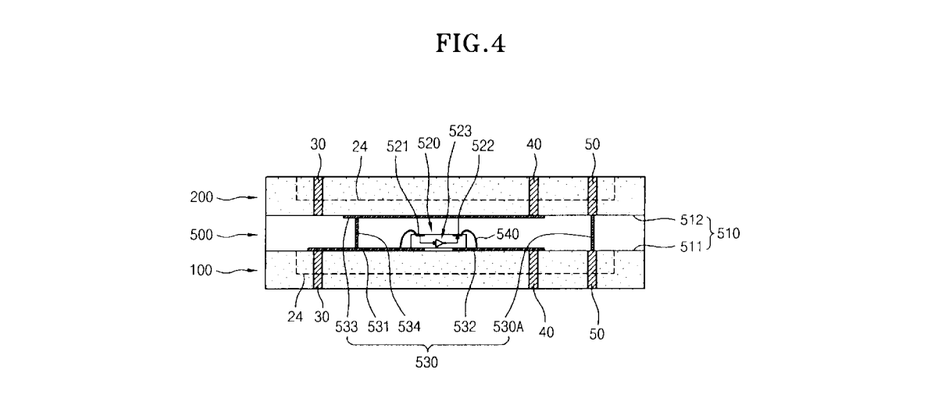

FIG. 4 is a cross-sectional view illustrating an embodiment of the spacer shown in FIG. 1.

This embodiment of the spacer 500 has substantially the same construction as exemplary embodiment of the spacer 500 described above with reference to FIG. 3, except for connection members 540. Therefore, repeated descriptions for the same component parts will be omitted, and the same technical terms and the same reference numerals will be used to refer to the same component parts.

Referring to FIG. 4, an embodiment of the spacer 500 includes a spacer body 510, an inverter chip 520, and wiring patterns 530. The spacer 500 further includes connection members 540.

In the present embodiment, the connection members 540 are formed as bonding wires connecting input terminal 521 of the inverter chip 520 with first circuit wiring line 531 and output terminal 522 of the inverter chip 520 with second circuit wiring line 532.

Figure 5:
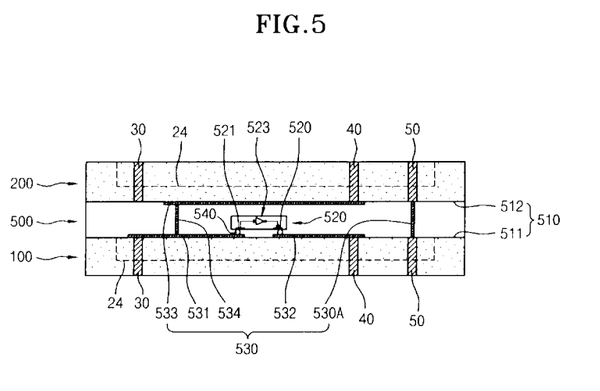

FIG. 5 is a cross-sectional view illustrating an embodiment of the spacer shown in FIG. 1.

This embodiment of the spacer has substantially the same construction as the exemplary embodiment of the spacer described above with reference to FIG. 3, except for connection members 540. Therefore, repeated descriptions for the same component parts will be omitted, and the same technical terms and the same reference numerals will be used to refer to the same component parts.

Referring to FIG. 5, an embodiment of the spacer 500 includes a spacer body 510, an inverter chip 520, and wiring patterns 530. The spacer 500 further includes connection members 540.

In the present embodiment, the connection members 540 are formed as bumps connecting input terminal 521 of the inverter chip 520 with first circuit wiring line 531 and output terminal 522 of the inverter chip 520 with second circuit wiring line 532.

Referring back to FIG. 1, the substrate 800 supports the first and second semiconductor chips 100 and 200 and the spacer 500.

The substrate 800 has an upper surface 810 which corresponds to the first semiconductor chip 100 and a lower surface 820 which faces away from the upper surface 810. Connection pads 830, which are connected with the first, second and third through-electrodes 30, 40 and 50 of the first semiconductor chip 100, are formed on the upper surface 810 of the substrate 800, and ball lands 840 are formed on the lower surface 820 of the substrate 800. While not shown in a drawing, the connection pads 830 and the ball lands 840 are connected with each other through conductive vias which are formed to pass through the upper surface 810 and the lower surface 820 of the substrate 800.

The external connection terminals 910 are attached to the ball lands 840 which are disposed on the lower surface 820 of the substrate 800. The external connection terminals 910 may include, for example, solder balls. The molding member 920 seals the upper surface 810 of the substrate 800 including the first and second semiconductor chips 100 and 200 and the spacer 500.

Figure 6:
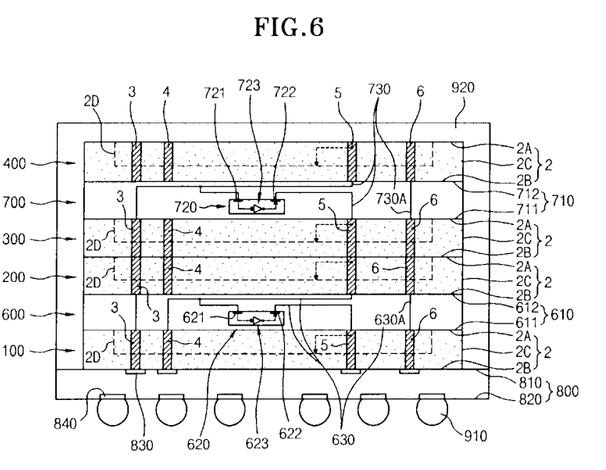
FIG. 6 is a cross-sectional view illustrating a stacked semiconductor package in accordance with an embodiment of the present invention.

FIG. 6 is a cross-sectional view illustrating a stacked semiconductor package in accordance with an embodiment of the present invention.

Referring to FIG. 6, a stacked semiconductor package 10' in accordance with an embodiment of the present invention includes first, second, third and fourth semiconductor chips 100, 200, 300 and 400, and first and second spacers 600 and 700. The stacked semiconductor package may further include a substrate 800, external connection terminals 910, and a molding member 920.

The first, second, third and fourth semiconductor chips 100, 200, 300 and 400 can be the same kind of semiconductor chips having the same structure.

Each of the first, second, third and fourth semiconductor chips 100, 200, 300 and 400 includes a semiconductor chip body 2, first through-electrodes 3, second through-electrodes 4, and third through-electrodes 5.

The semiconductor chip body 2 can possess, for example, a rectangular hexahedral shape. The semiconductor chip body 2 possessing a rectangular hexahedral shape has a first surface 2A, a second surface 2B, and side surfaces 2C. The first surface 2A faces away from the second surface 2B, and the side surfaces 2C connect the first surface 2A and the second surface 2B.

The semiconductor chip body 2 includes circuit units 2D and bonding pads (not shown). The circuit units 2D may include, for example, data storage sections (not shown) for storing data and data processing sections (not shown) for processing data. The bonding pads serve as electrical contact points of the circuit units 2D for connections external to the semiconductor chip body 2. The bonding pads can be disposed on the center portions of the top surface 2A of the semiconductor chip body 2 or adjacent to the edges of the top surface 2A of the semiconductor chip body 2. Various embodiments of the invention may place bonding pads on the bottom surface 2B, or on both the top surface 2A and the bottom surface 2B.

The first through-electrodes 3 pass through the top surface 2A and the bottom surface 2B of the semiconductor chip body 2 at first positions on the semiconductor chip body 2. The second through-electrodes 4 pass through the top surface 2A and the bottom surface 2B of the semiconductor chip body 2 at second positions on the semiconductor chip body 2. The third through-electrodes 5, which pass through the top surface 2A and the bottom surface 2B of the semiconductor chip body 2 at third positions on the semiconductor chip body 2, are connected with the circuit units 2D through the bonding pads. Accordingly, the third through-electrodes 5 may communicate a chip enable signal to the circuit units 2D. The chip enable signal may be from outside the stacked semiconductor package 10'. However, there may be cases where circuitry within the stacked semiconductor package 10' may generate the chip enable signal for other semiconductor chip bodies 2 in the same stacked semiconductor package 10'. For example, if a processor chip is packaged with memory chips, the processor chip may generate at least one enable signal for the memory chips.

Each of the first, second, third and fourth semiconductor chips 100, 200, 300, and 400 further includes fourth through-electrodes 6 for input and output of data. The fourth through-electrodes 6 pass through the top surface 2A and the bottom surface 2B of the semiconductor chip body 2, connect with the circuit units 2D through the bonding pads, and communicate data to and from the circuit units 2D.

The first spacer 600 is disposed between the first semiconductor chip 100 and the second semiconductor chip 200, and the second spacer 700 is disposed between the third semiconductor chip 300 and the fourth semiconductor chip 400. The first, second, third and fourth through-electrodes 3, 4, 5 and 6 of the third semiconductor chip 300 are directly connected to the first, second, third and fourth through-electrodes 3, 4, 5 and 6 of the second semiconductor chip 200.

The first spacer 600 includes a first spacer body 610, a first inverter chip 620, and first wiring patterns 630.

The first spacer body 610 has a first surface 611 and a second surface 612 which faces away from the first surface 611. The first surface 611 of the first spacer body 610 corresponds to the first semiconductor chip 100, and the second surface 612 of the first spacer body 610 corresponds to the second semiconductor chip 200. The first spacer body 610 may comprise, for example, prepreg and insulation film.

The first inverter chip 620 is formed in the first spacer body 610. The first inverter chip 620 includes at least one signal inversion unit 623 with input terminal 621 and output terminal 622. The signal inversion unit 623 inverts signals at its input terminal 621 and outputs the inverted signals through the output terminal 622. The signal inversion unit 623 may comprise, for example, a NOT gate.

The first wiring patterns 630 are formed in the first spacer body 610. The first wiring patterns 630 connect the first through-electrodes 3 of the first semiconductor chip 100 with the first through-electrodes 3 of the second semiconductor chip 200, the second through-electrodes 4 of the first semiconductor chip 100 with the third through-electrodes 5 of the second semiconductor chip 200, the second through-electrodes 4 of the first semiconductor chip 100 with the input terminal 621 of the first inverter chip 620, and the output terminal 622 of the first inverter chip 620 with the third through-electrodes 5 of the first semiconductor chip 100. The first wiring patterns 630 may also connect the fourth through-electrodes 6 of the first semiconductor chip 100 with the fourth through-electrodes 6 of the second semiconductor chip 200. The first wiring patterns 630 connecting the fourth through-electrodes 6 of the first semiconductor chip 100 with the fourth through-electrodes 6 of the second semiconductor chip 200 are defined as first data wiring lines 630A. The term defined in this way will be used hereafter.

While not shown in a drawing, conductive connection members are respectively formed between the first, second, third and fourth through-electrodes 3, 4, 5 and 6 of the first semiconductor chip 100 and the first wiring patterns 630, and between the first, third and fourth through-electrodes 3, 5 and 6 of the second semiconductor chip 200 and the first wiring patterns 630. The conductive connection members may comprise, for example, bumps, anisotropic conductive films, and solder balls.

Detailed configurations of the first spacer 600 will be clearly understood from the following descriptions with reference to FIGS. 7 through 10. The detailed configurations of the first spacer 600 will be described below with reference to FIGS. 7 through 10.

Figure 7:
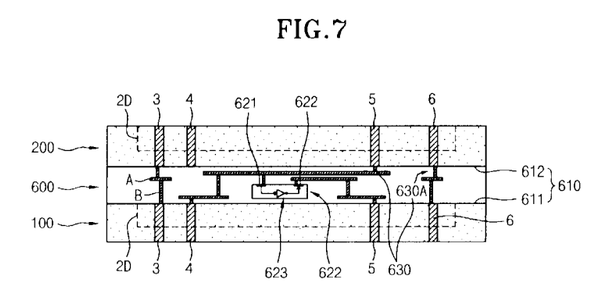
FIGS. 7 through 10 are cross-sectional views illustrating various embodiments of the first spacer shown in FIG. 6.

FIG. 7 is a cross-sectional view illustrating an embodiment of the first spacer shown in FIG. 6.

Referring to FIG. 7, an embodiment of the first spacer 600 includes a first spacer body 610, a first inverter chip 620, and first wiring patterns 630.

The first spacer body 610 has a first surface 611 and a second surface 612 which faces away from the first surface 611. The first surface 611 of the first spacer body 610 corresponds to a first semiconductor chip 100, and the second surface 612 of the first spacer body 610 corresponds to a second semiconductor chip 200. The first spacer body 610 may comprise, for example, prepreg and insulation film.

The inverter chip 620 in the spacer body 610 may comprise at least one signal inversion unit 623 with an input terminal 621 and an output terminal 622. The signal inversion unit 623 inverts the signals at the input terminal 621 and output the inverted signals through the output terminal 622. The signal inversion unit 623 may comprise, for example, a NOT gate.

The first wiring patterns 630 include multi-layered circuit wiring lines A and through-vias B formed in the first spacer body 610. The multi-layered circuit wiring lines A and the through-vias B, which constitute the first wiring patterns 630, connect first through-electrodes 3 of the first semiconductor chip 100 with first through-electrodes 3 of the second semiconductor chip 200, second through-electrodes 4 of the first semiconductor chip 100 with third through-electrodes 5 of the second semiconductor chip 200, the second through-electrodes 4 of the first semiconductor chip 100 with the input terminal 621 of the first inverter chip 620, and the output terminal 622 of the first inverter chip 620 with third through-electrodes 5 of the first semiconductor chip 100. The first wiring patterns 630 further include first data wiring lines 630A which connect fourth through-electrodes 6 of the first semiconductor chip 100 with fourth through-electrodes 6 of the second semiconductor chip 200.

Figure 8:
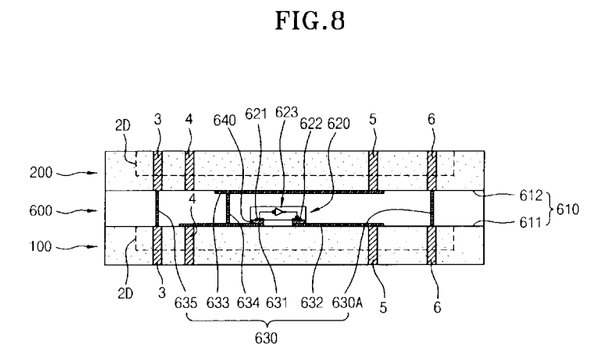

FIG. 8 is a cross-sectional view illustrating an embodiment of the first spacer shown in FIG. 6.

This embodiment of the first spacer has substantially the same construction as an embodiment of the first spacer described above with reference to FIG. 7, except for first wiring patterns 630. Therefore, repeated descriptions for the same component parts will be omitted, and the same technical terms and the same reference numerals will be used to refer to the same component parts.

Referring to FIG. 8, an embodiment of the first spacer 600 includes a first spacer body 610, a first inverter chip 620, and first wiring patterns 630. The first spacer 600 further includes first connection members 640.

The first wiring patterns 630 include first, second and third circuit wiring lines 631, 632 and 633 and first and second through-vias 634 and 635. Besides, the first wiring patterns 630 further include first data wiring lines 630A.

The first circuit wiring lines 631 are formed on a first surface 611 of the first spacer body 610 which corresponds to a first semiconductor chip 100, in such a way as to connect second through-electrodes 4 of the first semiconductor chip 100 with input terminal 621 of the first inverter chip 620. The second circuit wiring lines 632 are formed on the first surface 611 of the first spacer body 610 in such a way as to connect output terminal 622 of the first inverter chip 620 with third through-electrodes 5 of the first semiconductor chip 100.

In the present embodiment, the first connection members 640 are formed as anisotropic conductive films which connect the input terminal 621 of the first inverter chip 620 with the first circuit wiring lines 631 and the output terminal 622 of the first inverter chip 620 with the second circuit wiring lines 632.

The third circuit wiring lines 633 are formed on a second surface 612 of the first spacer body 610 which corresponds to a second semiconductor chip 200, in such a way as to be connected with third through-electrodes 5 of the second semiconductor chip 200.

The first through-vias 634 pass through the first surface 611 and the second surface 612 of the first spacer body 610 and connect the first circuit wiring lines 631 with the third circuit wiring lines 633. The second through-vias 635 pass through the first surface 611 and the second surface 612 of the first spacer body 610 and connect the first through-electrodes 3 of the first semiconductor chip 100 with the first through-electrodes 3 of the second semiconductor chip 200. The first data wiring lines 630A pass through the first surface 611 and the second surface 612 of the first spacer body 610 and connect fourth through-electrodes 6 of the first semiconductor chip 100 with fourth through-electrodes 6 of the second semiconductor chip 200.

Figure 9:
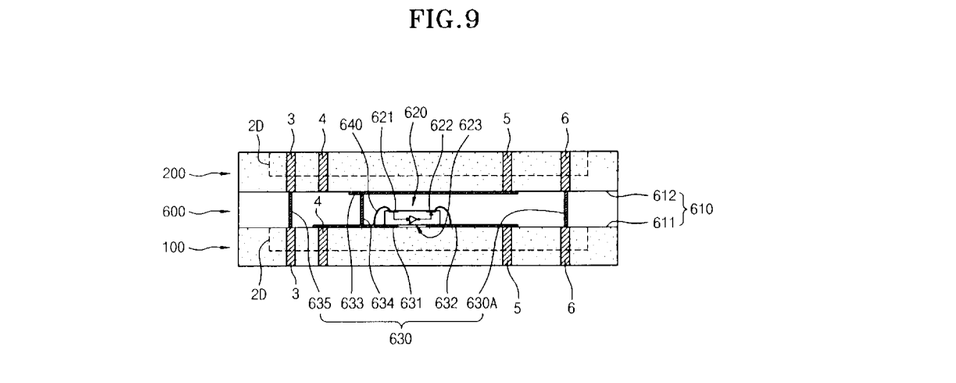

FIG. 9 is a cross-sectional view illustrating an embodiment of the first spacer shown in FIG. 6.

This embodiment of the first spacer 600 has substantially the same construction as the embodiment of the first spacer 600 described above with reference to FIG. 8, except for first connection members 640. Therefore, repeated descriptions for the same component parts will be omitted, and the same technical terms and the same reference numerals will be used to refer to the same component parts.

Referring to FIG. 9, an embodiment of the first spacer 600 includes a first spacer body 610, a first inverter chip 620, and first wiring patterns 630. The first spacer 600 further includes first connection members 640.

In the present embodiment, the first connection members 640 are formed as bonding wires which connect input terminal 621 of the first inverter chip 620 with first circuit wiring lines 631 and output terminal 622 of the first inverter chip 620 with second circuit wiring lines 632.

Figure 10:
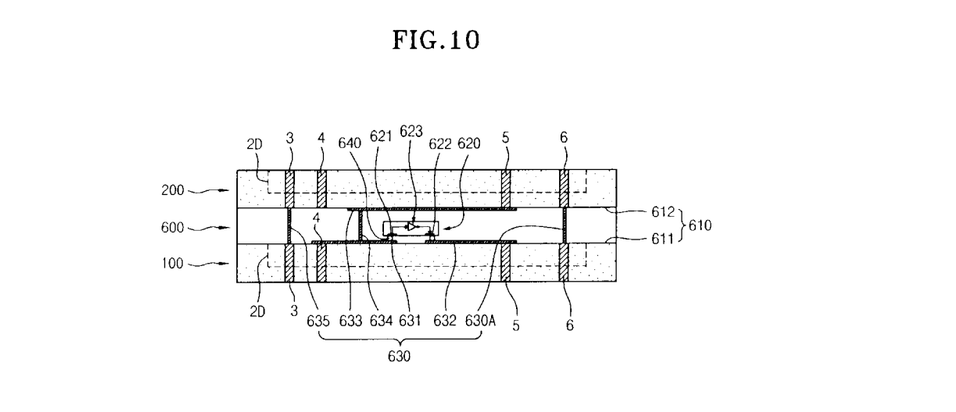

FIG. 10 is a cross-sectional view illustrating an embodiment of the first spacer shown in FIG. 6.

This embodiment of the first spacer 600 has substantially the same construction as the embodiment of the first spacer described above with reference to FIG. 8, except for first connection members 640. Therefore, repeated descriptions for the same component parts will be omitted, and the same technical terms and the same reference numerals will be used to refer to the same component parts.

Referring to FIG. 10, an embodiment of the first spacer 600 includes a first spacer body 610, a first inverter chip 620, and first wiring patterns 630. The first spacer 600 further includes first connection members 640.

In the present embodiment, the first connection members 640 are formed as bumps which connect input terminal 621 of the first inverter chip 620 with first circuit wiring lines 631 and output terminal 622 of the first inverter chip 620 with second circuit wiring lines 632.

Referring back to FIG. 6, the second spacer 700 includes a second spacer body 710, a second inverter chip 720, and second wiring patterns 730.

The second spacer body 710 has a first surface 711 and a second surface 712 which faces away from the first surface 711. The first surface 711 of the second spacer body 710 corresponds to the third semiconductor chip 300, and the second surface 712 of the second spacer body 710 corresponds to the fourth semiconductor chip 400. The second spacer body 710 may comprise, for example, prepreg and insulation film.

The inverter chip 720 in the spacer body 710 may comprise at least one signal inversion unit 723 with an input terminal 721 and an output terminal 722. The signal inversion unit 723 may invert the signals at the input terminal 721 and output the inverted signals through the output terminal 722. The signal inversion units 723 may comprise, for example, NOT gates.

The second wiring patterns 730 are formed in the second spacer body 710. The second wiring patterns 730 connect the first through-electrodes 3 of the third semiconductor chip 300 with the third through-electrodes 5 of the fourth semiconductor chip 400, the first through-electrodes 3 of the third semiconductor chip 300 with the input terminal 721 of the second inverter chip 720, and the output terminal 722 of the second inverter chip 720 with the third through-electrodes 5 of the third semiconductor chip 300. The second wiring patterns 730 connect the fourth through-electrodes 6 of the third semiconductor chip 300 with the fourth through-electrodes 6 of the fourth semiconductor chip 400. The second wiring patterns 730 which connect the fourth through-electrodes 6 of the third semiconductor chip 300 with the fourth through-electrodes 6 of the fourth semiconductor chip 400 are defined as second data wiring lines 730A. The term defined in this way will be used hereafter.

While not shown in a drawing, conductive connection members are respectively formed between the first, third and fourth through-electrodes 3, 5 and 6 of the third semiconductor chip 300 and the second wiring patterns 730, and between the third and fourth through-electrodes 5 and 6 of the fourth semiconductor chip 400 and the second wiring patterns 730. The conductive connection members may include, for example, bumps, anisotropic conductive films and solder balls.

Detailed configurations of the second spacer 700 will be clearly understood from the following descriptions with reference to FIGS. 11 through 14.

The detailed configurations of the second spacer 700 will be described below with reference to FIGS. 11 through 14.

Figure 11:
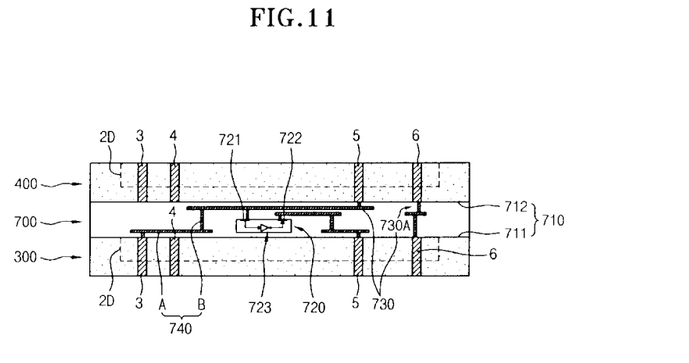
FIGS. 11 through 14 are cross-sectional views illustrating various embodiments of the second spacer shown in FIG. 6.

FIG. 11 is a cross-sectional view illustrating an embodiment of the second spacer shown in FIG. 6.

Referring to FIG. 11, an embodiment of the second spacer 700 includes a second spacer body 710, a second inverter chip 720, and second wiring patterns 730.

The second spacer body 710 has a first surface 711 and a second surface 712 which faces away from the first surface 711. The first surface 711 of the second spacer body 710 corresponds to a third semiconductor chip 300, and the second surface 712 of the second spacer body 710 corresponds to a fourth semiconductor chip 400. The second spacer body 710 may comprise, for example, prepreg and insulation film.

The inverter chip 720 in the spacer body 710 may comprise at least one signal inversion unit 723 with an input terminal 721 and an output terminal 722.

The signal inversion unit 723 inverts the signals at the input terminal 721 and output the inverted signals through the output terminal 722. The signal inversion units 723 may comprise, for example, NOT gates.

The second wiring patterns 730 include multi-layered circuit wiring lines A and through-vias B which are formed in the second spacer body 710. The multi-layered circuit wiring lines A and the through-vias B, which constitute the second wiring patterns 730, connect first through-electrodes 3 of the third semiconductor chip 300 with third through-electrodes 5 of the fourth semiconductor chip 400, the first through-electrodes 3 of the third semiconductor chip 300 with the input terminal 721 of the second inverter chip 720, and the output terminal 722 of the second inverter chip 720 with third through-electrodes 5 of the third semiconductor chip 300. The second wiring patterns 730 further include second data wiring lines 730A which connect fourth through-electrodes 6 of the third semiconductor chip 300 with fourth through-electrodes 6 of the fourth semiconductor chip 400.

Figure 12:
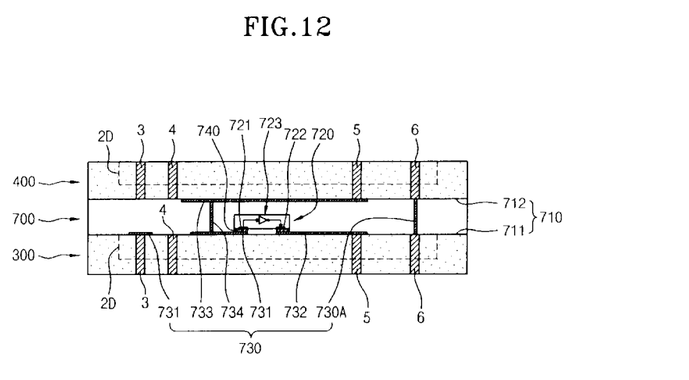

FIG. 12 is a cross-sectional view illustrating an embodiment of the second spacer shown in FIG. 6.

This embodiment of the second spacer has substantially the same construction as an embodiment of the second spacer described above with reference to FIG. 11, except for second wiring patterns 730. Therefore, repeated descriptions for the same component parts will be omitted, and the same technical terms and the same reference numerals will be used to refer to the same component parts.

Referring to FIG. 12, an embodiment of the second spacer 700 includes a second spacer body 710, a second inverter chip 720, and second wiring patterns 730. The second spacer 700 further includes second connection members 740.

The second wiring patterns 730 include fourth, fifth and sixth circuit wiring lines 731, 732 and 733 and third through-vias 734. The second wiring patterns 730 further include second data wiring lines 730A.

The fourth circuit wiring lines 731 are formed on a first surface 711 of the second spacer body 710 which corresponds to a third semiconductor chip 300, in such a way as to connect first through-electrodes 3 of the third semiconductor chip 300 with input terminal 721 of the second inverter chip 720. The fifth circuit wiring lines 732 are formed on the first surface 711 of the second spacer body 710 in such a way as to connect output terminal 722 of the second inverter chip 720 with third through-electrodes 5 of the third semiconductor chip 300. In FIG. 12, The forth circuit wiring line 731 seems to comprise two pieces separated each other, in fact the forth circuit wiring line 731 is single line. Remind that FIG. 12 is a cross-sectional view.

In the present embodiment, the second connection members 740 are formed as anisotropic conductive films which connect the input terminal 721 of the second inverter chip 720 with the fourth circuit wiring lines 731 and the output terminal 722 of the second inverter chip 720 with the fifth circuit wiring lines 732.

The sixth circuit wiring lines 733 are formed on a second surface 712 of the second spacer body 710 which corresponds to a fourth semiconductor chip 400, in such a way as to be connected with third through-electrodes 5 of the fourth semiconductor chip 400. The third through-vias 734 pass through the first surface 711 and the second surface 712 of the second spacer body 710 and connect the fourth circuit wiring lines 731 with the sixth circuit wiring lines 733.

The second data wiring lines 730A are formed as through-vias which pass through the first surface 711 and the second surface 712 of the second spacer body 710 and connect fourth through-electrodes 6 of the third semiconductor chip 300 with fourth through-electrodes 6 of the fourth semiconductor chip 400.

Figure 13:
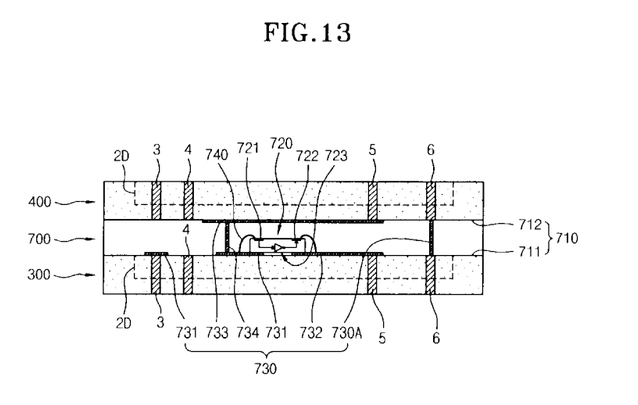

FIG. 13 is a cross-sectional view illustrating an embodiment of the second spacer shown in FIG. 6.

This embodiment of the second spacer has substantially the same construction as an embodiment of the second spacer described above with reference to FIG. 12, except for second connection members 740. Therefore, repeated descriptions for the same component parts will be omitted herein, and the same technical terms and the same reference numerals will be used to refer to the same component parts.

Referring to FIG. 13, an embodiment of the second spacer 700 includes a second spacer body 710, a second inverter chip 720, and second wiring patterns 730. The second spacer 700 further includes second connection members 740.

In the present embodiment, the second connection members 740 are formed as bonding wires which connect input terminal 721 of the second inverter chip 720 with fourth circuit wiring lines 731 and output terminal 722 of the second inverter chip 720 with fifth circuit wiring lines 732.

Figure 14:
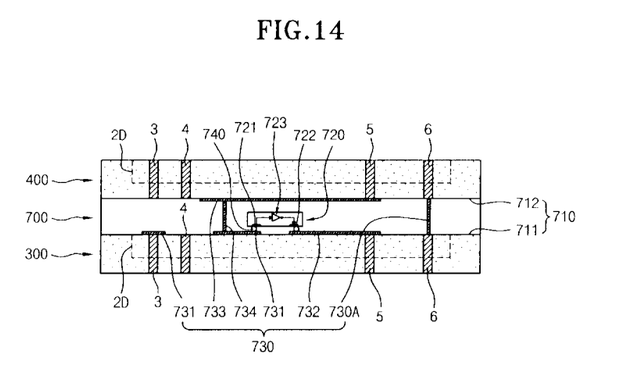

FIG. 14 is a cross-sectional view illustrating an embodiment of the second spacer shown in FIG. 6.

This embodiment of the second spacer has substantially the same construction as the second embodiment of the second spacer described above with reference to FIG. 12, except for second connection members 740. Therefore, repeated descriptions for the same component parts will be omitted, and the same technical terms and the same reference numerals will be used to refer to the same component parts.

Referring to FIG. 14, an embodiment of the second spacer 700 includes a second spacer body 710, a second inverter chip 720, and second wiring patterns 730. The second spacer 700 further includes second connection members 740.

In the present embodiment, the second connection members 740 are formed as bumps which connect input terminal 721 of the second inverter chip 720 with fourth circuit wiring lines 731 and output terminal 722 of the second inverter chip 720 with fifth circuit wiring lines 732. In FIG. 14, The forth circuit wiring line 731 seems to comprise two pieces separated each other, in fact the forth circuit wiring line 731 is single line. Remind that FIG. 14 is a cross-sectional view.

Referring back to FIG. 6, the substrate 800 supports the first, second, third and fourth semiconductor chips 100, 200, 300 and 400 and the first and second spacers 600 and 700. The substrate 800 has an upper surface 810 which corresponds to the first semiconductor chip 100 and a lower surface 820 which faces away from the upper surface 810. Connection pads 830, which are connected with the first, second, third and fourth through-electrodes 3, 4, 5 and 6 of the first semiconductor chip 100, are formed on the upper surface 810 of the substrate 800, and ball lands 840 are formed on the lower surface 820 of the substrate 800. While not shown in a drawing, the connection pads 830 and the ball lands 840 are connected with each other through conductive vias formed to pass through the upper surface 810 and the lower surface 820 of the substrate 800.

The external connection terminals 910 are attached to the ball lands 840 which are disposed on the lower surface 820 of the substrate 800. The external connection terminals 910 may comprise, for example, solder balls.

The molding member 920 seals the upper surface 810 of the substrate 800 including the first, second, third and fourth semiconductor chips 100, 200, 300 and 400 and the first and second spacers 600 and 700.

As is apparent from the above description of the various embodiments of the present invention, a spacer having an inverter embedded therein is interposed between two semiconductor chips which are stacked using through-electrodes. Through use of the inverter, one chip enable signal may be made into two chip enable signals that are of opposite polarity, and which are provided to the two semiconductor chips adjacent to the spacer. This method may allow selection of a single semiconductor chip from a plurality of stacked semiconductor chips.

It was stated above that a semiconductor package had the same kind of chips and the chips had the same kind of structure. However, this was for ease of explaining the various embodiments of the invention. The invention may also be used, for example, when different kinds of semiconductor chips are in the same semiconductor package and/or if the semiconductor chips are of different structure. Accordingly, there is no limitation for the types of chips that may be used with an embodiment of the invention.

The inverter chip in the semiconductor packages were exemplarily described as NOT gates. However, the invention need not be so limited. The inverter may be, for example, a NOR gate, a NAND gate, a XOR gate, a XNOR gate, or an appropriate transistor configuration.

Also, while only a single routing and mounting configuration was shown when the inverter input/output leads point up, the invention need no be so limited. Similar routing and mounting configurations may be used when the inverter leads point up as when they point down. Additionally, an embodiment of the invention need not be limited to the exemplary routing configurations shown in this application.

Additionally, while the various exemplary embodiments of the invention may have been shown as comprising a spacer in between two semiconductor chips, the invention need not be so limited. For example, the spacer may be below both semiconductor chips, or the spacer may be above both semiconductor chips. Additionally, some embodiments of the invention may not use a spacer, but may have the inverter embedded in one of the semiconductor chips.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked semiconductor package comprising:
   first and second semiconductor chips including semiconductor chip bodies which have circuit units, first through-electrodes which pass through the semiconductor chip bodies at first positions, and second through-electrodes which pass through the semiconductor chip bodies at second positions and provide a chip enable signal to the circuit units; and
   a spacer including a spacer body which is interposed between the first semiconductor chip and the second semiconductor chip, an inverter chip which is embedded in the spacer body, and wiring patterns which are formed on the spacer body and connect the first through-electrodes of the first semiconductor chip with the second through-electrodes of the second semiconductor chip, the first through-electrodes of the first semiconductor chip with input terminals of the inverter chip, and output terminals of the inverter chip with the second through-electrodes of the first semiconductor chip.

2. The stacked semiconductor package according to claim 1, wherein the first and second semiconductor chips are the same kind.

3. The stacked semiconductor package according to claim 1, wherein the first and second semiconductor chips further include third through-electrodes which pass through the respective semiconductor chip bodies and provide data inputted from an outside to the circuit units or output data provided from the circuit units to the outside.

4. The stacked semiconductor package according to claim 3, wherein the wiring patterns include data wiring lines which connect the third through-electrodes of the first semiconductor chip with the third through-electrodes of the second semiconductor chip.

5. The stacked semiconductor package according to claim 1, wherein the spacer body comprises a prepreg and an insulation film.

6. The stacked semiconductor package according to claim 1, wherein the wiring patterns comprise multi-layered circuit wiring lines and through-vias which are formed in the spacer body and connect the first through-electrodes of the first semiconductor chip with the second through-electrodes of the second semiconductor chip, the first through-electrodes of the first semiconductor chip with the input terminals of the inverter chip, and the output terminals of the inverter chip with the second through-electrodes of the first semiconductor chip.

7. The stacked semiconductor package according to claim 1, wherein the wiring patterns comprise:
   first circuit wiring lines formed on a first surface of the spacer body which corresponds to the first semiconductor chip, and connecting the first through-electrodes of the first semiconductor chip with the input terminals of the inverter chip;

second circuit wiring lines formed on the first surface of the spacer body and connecting the output terminals of the inverter chip with the second through-electrodes of the first semiconductor chip;

third circuit wiring lines formed on a second surface of the spacer body which faces away from the first surface, and connected to the second through-electrodes of the second semiconductor chip; and first through-vias passing through the first and second surfaces of the spacer body and connecting the first circuit wiring lines with the third circuit wiring lines.

8. The stacked semiconductor package according to claim 7, further comprising:

connection members formed between the input terminals of the inverter chip and the first circuit wiring lines and between the output terminals of the inverter chip and the second circuit wiring lines.

9. The stacked semiconductor package according to claim 8, wherein the connection members comprise bonding wires, bumps, or anisotropic conductive films.

10. The stacked semiconductor package according to claim 1, further comprising:

conductive connection members formed between the first and second through-electrodes of the first semiconductor chip and the wiring patterns and between the second through-electrodes of the second semiconductor chip and the wiring patterns.

11. The stacked semiconductor package according to claim 10, wherein the conductive connection members comprise bumps, anisotropic conductive films or solder balls.

12. The stacked semiconductor package according to claim 1, further comprising:

a substrate supporting the first and second semiconductor chips and the spacer, and having an upper surface which corresponds to the first semiconductor chip and on which connection pads connected with the first and second through-electrodes of the first semiconductor chip are disposed and a lower surface which faces away from the upper surface and on which ball lands are disposed;

a molding member sealing the upper surface of the substrate including the first and second semiconductor chips and the spacer; and external connection terminals attached to the ball lands.

13. A stacked semiconductor package comprising:

first, second, third and fourth semiconductor chips including semiconductor chip bodies which have circuit units, first and second through-electrodes which pass through the semiconductor chip bodies at first positions and second positions, and third through-electrodes which pass through the semiconductor chip bodies at third positions and provide a chip enable signal to the circuit units;

a first spacer including a first spacer body which is interposed between the first semiconductor chip and the second semiconductor chip, a first inverter chip which is embedded in the first spacer body, and first wiring patterns which are formed on the first spacer body and connect the first through-electrodes of the first semiconductor chip with the first through-electrodes of the second semiconductor chip, the second through-electrodes of the first semiconductor chip with the third through-electrodes of the second semiconductor chip, the second through-electrodes of the first semiconductor chip with input terminals of the first inverter chip, and output terminals of the first inverter chip with the third through-electrodes of the first semiconductor chip; and a second spacer including a second spacer body which is interposed between the third semiconductor chip and the fourth semiconductor chip, a second inverter chip which is embedded in the second spacer body, and second wiring patterns which are formed on the second spacer body and connect the first through-electrodes of the third semiconductor chip with the first through-electrodes of the fourth semiconductor chip, the first through-electrodes of the third semiconductor chip with input terminals of the second inverter chip, and output terminals of the second inverter chip with the third through-electrodes of the third semiconductor chip, wherein the first, second and third through-electrodes of the third semiconductor chip are respectively mounted to the first, second and third through-electrodes of the second semiconductor chip.

14. The stacked semiconductor package according to claim 13, wherein the first, second, third and fourth semiconductor chips are the same kind.

15. The stacked semiconductor package according to claim 13, wherein the first, second, third and fourth semiconductor chips further include fourth through-electrodes which pass through the respective semiconductor chip bodies and provide data inputted from an outside to the circuit units or output data from the circuit units to the outside.

16. The stacked semiconductor package according to claim 15, wherein the first wiring patterns include data wiring lines which connect the fourth through-electrodes of the first semiconductor chip with the fourth through-electrodes of the second semiconductor chip.

17. The stacked semiconductor package according to claim 13, wherein each of the first and second spacer bodies comprises a prepreg and an insulation film.

18. The stacked semiconductor package according to claim 13, wherein the first wiring patterns comprise multi-layered circuit wiring lines and through-vias which are formed in the first spacer body and connect the first through-electrodes of the first semiconductor chip with the first through-electrodes of the second semiconductor chip, the second through-electrodes of the first semiconductor chip with the third through-electrodes of the second semiconductor chip, the second through-electrodes of the first semiconductor chip with the input terminals of the first inverter chip, and the output terminals of the first inverter chip with the third through-electrodes of the first semiconductor chip.

19. The stacked semiconductor package according to claim 13, wherein the first wiring patterns comprise:

first circuit wiring lines formed on a first surface of the first spacer body which corresponds to the first semiconductor chip, and connecting the second through-electrodes of the first semiconductor chip with the input terminals of the first inverter chip;

second circuit wiring lines formed on the first surface of the first spacer body and connecting the output terminals of the first inverter chip with the third through-electrodes of the first semiconductor chip;

third circuit wiring lines formed on a second surface of the first spacer body which faces away from the first surface, and connected to the third through-electrodes of the second semiconductor chip;

first through-vias passing through the first and second surfaces of the first spacer body and connecting the first through-electrodes of the first semiconductor chip with the first through-electrodes of the second semiconductor chip; and second through-vias passing through the first and second surfaces of the first spacer body and connecting the first circuit wiring lines with the third circuit wiring lines.

20. The stacked semiconductor package according to claim 19, further comprising:
connection members formed between the input terminals of the first inverter chip and the first circuit wiring lines and between the output terminals of the first inverter chip and the second circuit wiring lines.

21. The stacked semiconductor package according to claim 20, wherein the connection members comprise bonding wires, bumps, or anisotropic conductive films.

22. The stacked semiconductor package according to claim 13, wherein the second wiring patterns comprise multi-layered circuit wiring lines and through-vias which are formed in the second spacer body and connect the first through-electrodes of the third semiconductor chip with the third through-electrodes of the fourth semiconductor chip, the first through-electrodes of the third semiconductor chip with the input terminals of the second inverter chip, and the output terminals of the second inverter chip with the third through-electrodes of the third semiconductor chip.

23. The stacked semiconductor package according to claim 13, wherein the second wiring patterns comprise:
fourth circuit wiring lines formed on a first surface of the second spacer body which corresponds to the third semiconductor chip, and connecting the first through-electrodes of the third semiconductor chip with the input terminals of the second inverter chip;
fifth circuit wiring lines formed on the first surface of the second spacer body and connecting the output terminals of the second inverter chip with the third through-electrodes of the third semiconductor chip;
sixth circuit wiring lines formed on a second surface of the second spacer body which faces away from the first surface, and connected to the third through-electrodes of the fourth semiconductor chip; and
third through-vias passing through the first and second surfaces of the second spacer body and connecting the fourth circuit wiring lines with the sixth circuit wiring lines.

24. The stacked semiconductor package according to claim 23, further comprising:
connection members formed between the input terminals of the second inverter chip and the fourth circuit wiring lines and between the output terminals of the second inverter chip and the fifth circuit wiring lines.

25. The stacked semiconductor package according to claim 24, wherein the connection members comprise bonding wires, bumps, or anisotropic conductive films.

26. The stacked semiconductor package according to claim 13, further comprising:
conductive connection members formed between the first, second and third through-electrodes of the first semiconductor chip and the first wiring patterns, between the first and third through-electrodes of the second semiconductor chip and the first wiring patterns, between the first and third through-electrodes of the third semiconductor chip and the second wiring patterns, and between the third through-electrodes of the fourth semiconductor chip and the second wiring patterns.

27. The stacked semiconductor package according to claim 26, wherein the conductive connection members comprise bumps, anisotropic conductive films or solder balls.

28. The stacked semiconductor package according to claim 13, further comprising:
a substrate supporting the first, second, third and fourth semiconductor chips and the first and second spacers, and having an upper surface which corresponds to the first semiconductor chip and on which connection pads connected with the first, second and third through-electrodes of the first semiconductor chip are disposed and a lower surface which faces away from the upper surface and on which ball lands are disposed;
a molding member sealing the upper surface of the substrate including the first, second, third and fourth semiconductor chips and the first and second spacer; and
external connection terminals attached to the ball lands.

* * * * *